United States Patent [19]

Adachi et al.

[11] 4,293,768

[45] Oct. 6, 1981

[54] INFRARED RADIATION DETECTING APPARATUS AND METHOD OF MANUFACTURING

[75] Inventors: Hideo Adachi, Kyoto; Kiichi Minai, Shiga; Kozo Moriyasu; Shunjiro Imagawa, both of Muko, all of Japan

[73] Assignee: Murata Manufacturing Co., Ltd., Japan

[21] Appl. No.: 31,048

[22] Filed: Apr. 18, 1979

[30] Foreign Application Priority Data

Apr. 26, 1978 [JP] Japan .................................. 53-50373

[51] Int. Cl.³ .......................... G01J 1/00; H04N 9/27
[52] U.S. Cl. .................................. 250/338; 250/342; 357/72
[58] Field of Search ...................... 250/338, 342, 352; 29/424, 592; 310/312; 357/72

[56] References Cited

U.S. PATENT DOCUMENTS

| | | | |
|---|---|---|---|
| 3,098,380 | 7/1963 | Suomi et al. | 250/338 |
| 3,452,198 | 6/1969 | White | 250/338 |
| 3,539,803 | 11/1970 | Beerman | 250/338 |
| 3,689,804 | 9/1972 | Ishihama et al. | 357/72 |
| 4,001,863 | 1/1977 | Kobayashi et al. | 357/72 |
| 4,009,516 | 3/1977 | Chiang et al. | 250/338 |

Primary Examiner—Alfred E. Smith
Assistant Examiner—Janice A. Howell
Attorney, Agent, or Firm—Ostrolenk, Faber, Gerb & Soffen

[57] ABSTRACT

An infrared radiation sensing device such as a pyroelectric effect device is mounted on one surface of an insulating substrate of alumina ceramic or the like. External connection leads are provided on the insulating substrate. A field effect transistor is provided on the other surface of the insulating substrate for amplifying the signal generated in the sensing device by incident infrared radiation. The apparatus is suitably encapsulated in a layer of resin.

27 Claims, 17 Drawing Figures

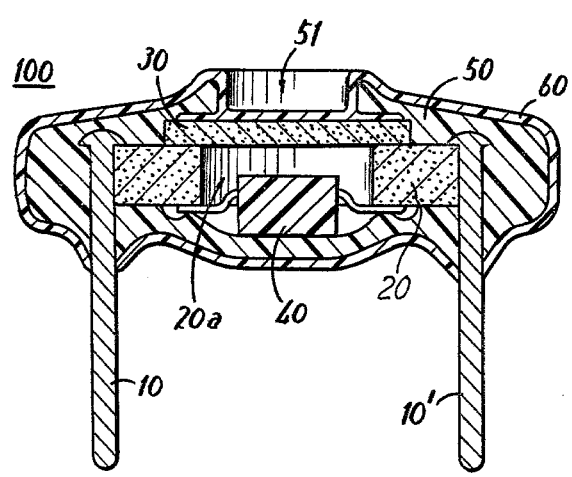
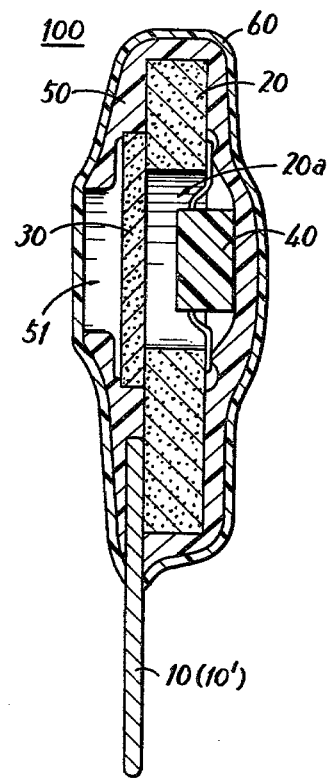
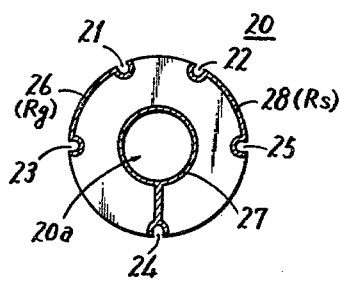
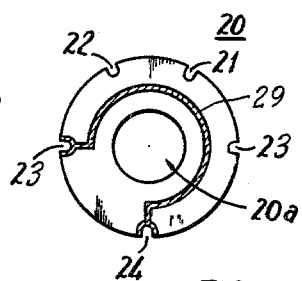
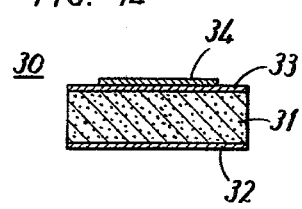
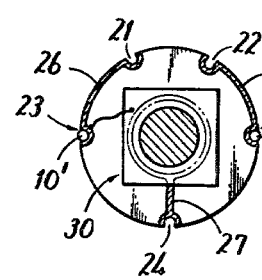
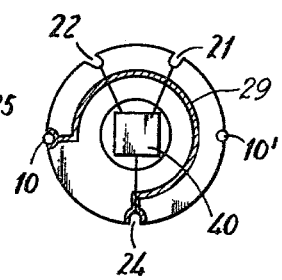

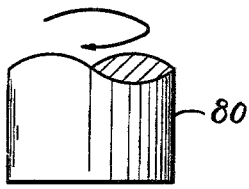
FIG. 10
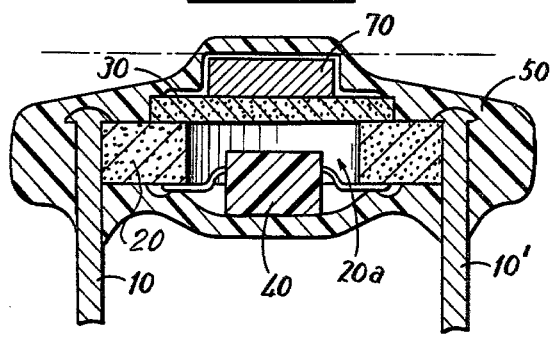
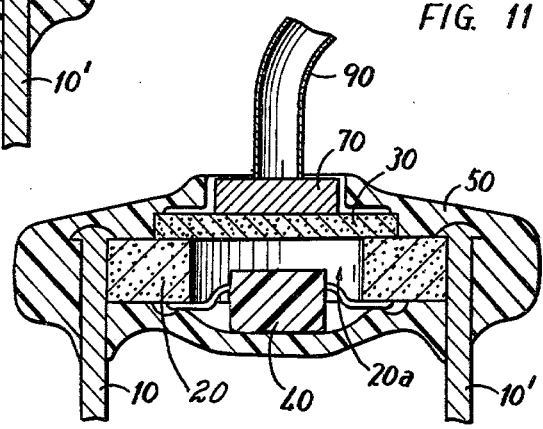
FIG. 11
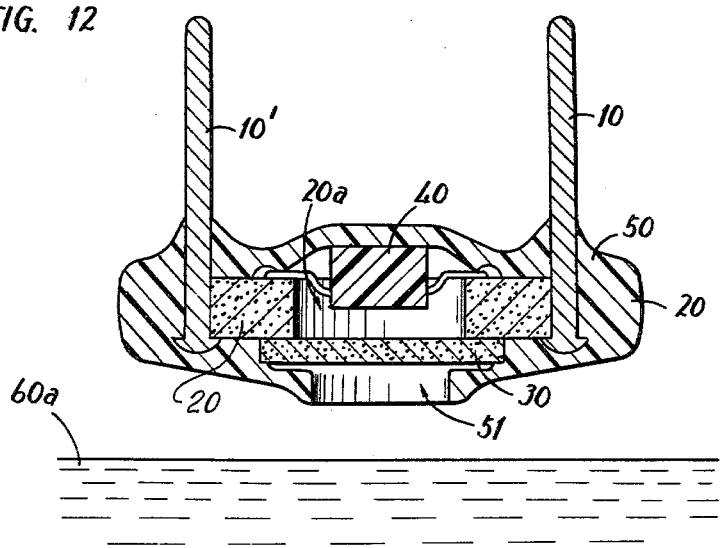
FIG. 12

INFRARED RADIATION DETECTING APPARATUS AND METHOD OF MANUFACTURING

BACKGROUND OF THE INVENTION

1. Field of the Invention

The present invention relates to an infrared radiation detecting apparatus and a method for manufacturing it. More specifically, the present invention relates to a thermal type infrared radiation detecting apparatus employing an infrared radiation sensing device of a pyroelectric effect type and completed with a novel package structure and a method for manufacturing it.

2. Description of the Prior Art

A thermal type infrared radiation detecting apparatus those employing a pyroelectric effect type sensing device, a thermistor bolometer and the like have been proposed and put into practical use. FIG. 1 shows a sectional view of an infrared radiation detecting apparatus employing a prior art thermal type sensing device, which constitutes the background of the invention. The conventional infrared radiation detecting apparatus as shown in FIG. 1 comprises an insulating substrate 2, external connection pins 1 and 1' fixed to the insulating substrate 2 so as to extend through the insulating substrate 2, an infrared radiation sensing device 3 provided on the insulating substrate 2, and a hermetic base 5 fixed to the insulating substrate 2 through a spacer 4. A metallic casing 6 having an aperture 6a for receiving infrared radiation is hermetically sealed to the hermetic base 5 so as to enclose the insulating substrate 2. The aperture 6a of the metallic casing 6 is provided with a window member 6 of a material transmissible of infrared radiation of a desired wavelength region.

As well known, a package of such a hermetic seal structure performs an electric shield effect in view of the fact that a casing is metallic. In addition, such package provides a mechanically strong structure. Nevertheless, a thermal type infrared radiation detecting apparatus employing such package suffers from various shortcomings to be described in the following. Firstly, since such package structure is expensive, such package can be employed only in infrared radiation detecting apparatuses of particular applications which allow a high cost. Secondly, such package structure makes it difficult to implement a so-called longitudinal structure in which the external connection leads extend parallel to the substrate. Thirdly, such a package structure makes it difficult to employ flexible insulated lead wires as external connection leads. As the fourth disadvantage, since the casing is metallic, when the window member 7 of a resinous material such as polyethylene is adhered to the opening 6a by means of an adhesive agent, the adhesive agent comes into contact with the infrared radiation transmitting portion of the window member, which causes variability in the sensitivity of the detecting apparatus and degrades manufacturing efficiency. As the fifth disadvantage, since the heat capacity of the metallic casing is relatively large, dew is deposited on the surface of the casing when the ambient temperature of the detecting apparatus suddenly changes from low to high. Dew on the window member can interrupt the incident infrared radiation, and the moisture can enter the casing through the interface between the window member and the casing. As the sixth disadvantage, since the metallic casing is a good conductor of heat, and usually the substrate for supporting the sensing device is made of alumina which is also a good conductor of heat, any contact between the casing and the substrate accidentally occurring during assembly makes it difficult to detect slowly varying infrared radiation energy. As the seventh disadvantage, the metallic casing makes the package unavoidably bulky and difficult to miniaturize. As the eighth disadvantage, in the case where a field effect transistor is housed in the casing as a subsequent stage of the sensing device for the purpose of impedance conversion and amplification of the detected signal, it is required that the field effect transistor be coated with a resinous material in order to prevent the field effect transistor by being adversely affected from the moisture entering the casing, since commercially available field effect transistors resist moisture poorly.

SUMMARY OF THE INVENTION

Briefly described, the present invention comprises an infrared radiation detecting apparatus wherein the surface of an infrared radiation sensing device, excluding the radiation receiving portion of it and a portion to which external connection leads are attached is coated with an insulating material. Preferably, the entire infrared radiation detecting apparatus except the external connection leads is also given a coat of a resinous material that transmits infrared radiation of a predetermined wavelength region.

According to the present invention, an infrared radiation detecting apparatus can be inexpensively mass-produced with high efficiency, while the freedom of choosing the shape and structure of the apparatus is increased. More specifically, the present invention readily enables a so-called longitudinal type wherein external connection leads are withdrawn to extend in parallel with the radiation receiving surface of the detecting apparatus, a so-called lateral type wherein external connection leads are withdrawn to extend in the direction normal to the radiation receiving surface of the detecting apparatus, employment of a flexible insulated lead wire as external connection leads, and the like. As a result, an improved infrared radiation detecting apparatus can be provided wherein designing flexibility in enhanced and the geometry suited for fixing the same is employed. In addition, according to the present invention, an infrared radiation detecting apparatus can be manufactured without any fear that an adhesive agent and the like flows up to the radiation receiving surface of the infrared radiation sensing device, which enhances efficiency of fabricating work. Since according to the present invention an enclosure of the detecting apparatus is made of a synthetic resinous material, an abrupt change of the ambient temperature does not cause deposition of dew on the enclosure, which eliminates any unfavorable influence on infrared radiation detection because of deposition of dew.

Accordingly, a principal object of the present invention is to provide an infrared radiation detecting apparatus with an improved package structure.

A further object of the present invention is to provide a method for manufacturing an infrared radiation detecting apparatus with an improved package.

These objects and other objects, features, aspects and advantages of the present invention will become more apparent from the following detailed description of the present invention, when taken in conjunction with the accompanying drawings.

BRIEF DESCRIPTION OF THE DRAWINGS

FIG. 4 shows a sectional view of another embodiment of the present invention;

FIG. 5 is a sectional view of a further embodiment of the present invention;

FIGS. 6 to 12 each show a sectional view of the FIG. 2 embodiment at several stages of the manufacturing process thereof;

FIGS. 13A and 13B show an example of an insulating substrate for use in the present invention, wherein FIGS. 13A and 13B showing the front surface and the rear surface thereof, respectively;

FIG. 14 is a sectional view of a pyroelectric effect type infrared radiation sensing device for use in the present invention; and FIGS. 15A and 15B show an arrangement of an infrared radiation sensing device on an insulating substrate, illustrating the relation between a pyroelectric infrared radiation sensing device and a field effect transistor after the process shown in FIG. 8, FIGS. 15A and 15B showing the front surface and the rear surface thereof, respectively.

DESCRIPTION OF THE PREFERRED EMBODIMENTS

Prior to a detailed description of the preferred embodiments of the present invention, it is to be pointed out that although in the following the present invention will be described specifically as embodied in an infrared radiation detecting apparatus employing a thermal type infrared radiation sensing device, such as a pyroelectric effect sensing device formed as a chip of $LiTaO_3$, $PbTiO_3$, SBN, PZT or the like, the present invention can equally will have the form of any other thermal type infrared radiation sensing device, such as those made of a composite oxide of Ni, Co, Mn, Cu, Fe or the like formed in a flake shape, or a composite comprising a substrate and a thick or a thin film of such a composite oxide deposited thereon, i.e. a thermistor bolometer. It is further to be pointed out that the present invention can be employed in an infrared radiation detecting apparatus employing a photoelectric converting semiconductor device to convert infrared radiation into an electrical signal.

Figure 1:
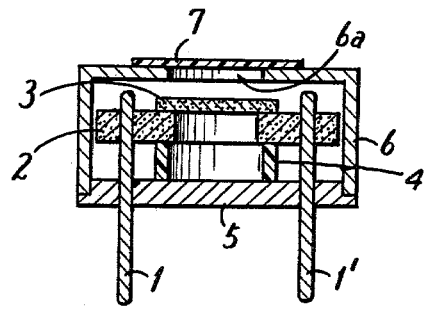
FIG. 1 shows a sectional view of a conventional thermal type infrared radiation detecting apparatus, which constitutes the background of the present invention.
Figure 2:
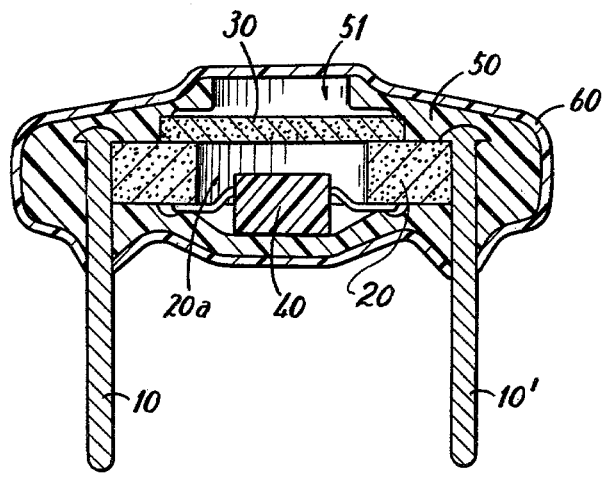
FIG. 2 is a sectional view of one embodiment of a thermal type infrared radiation detecting apparatus in accordance with the present invention.

FIG. 2 shows a sectional view of one embodiment of the present invention. The embodiment shown comprises an insulating substrate 20 made of alumina ceramic, for example. An infrared radiation sensing device 30 is provided on one main surface of the insulating substrate 20 at the central portion thereof. The insulating substrate 20 may be formed with an aperture 20a at the central portion thereof underneath the infrared radiation sensing device 30, to decrease the dissipation of heat from the infrared radiation sensing device 30. Thus, the aperture 20a is formed to decrease the effectiveness of substrate 20 as a heat sink for the infrared radiation sensing device 30. Therefore the aperture 20a can be dispensed with by interposing a heat insulating spacer between the infrared radiation sensing device 30 and the insulating substrate 20. However, in the embodiment shown, the aperture 20a is also advantageously used for accommodating a field effect transistor 40 thereby effectively decreasing the total thickness of the inventive infrared detecting apparatus. Pin-like external connection leads 10 and 10' are fixed to the insulating substrate 20 so as to extend through the periphery of the insulating substrate 20. These external connection leads 10 and 10' may be made of a highly conductive metallic material such as copper. As briefly described previously, the infrared radiation sensing device 30 is fixed with an electrically conductive adhesive agent to one surface of the insulating substrate 20 so as to cover the aperture 20a.

The infrared radiation sensing device 30 may be a pyroelectric effect sensing device, for example, and is structured, in section, as shown in FIG. 14. More specifically, referring to FIG. 14, the infrared radiation sensing device 30 comprises a ceramic substrate 31 made of such a material as $PbTiO_3$, electrodes 32 and 33 deposited on both main surfaces of the ceramic substrate 31, and a black film 34 of such as carbon black deposited on the surface of one electrode 33. The ceramic substrate 31 is polarized by application of a voltage between the electrodes 32 and 33 to make it pyroelectric. The black film 34 constitutes a radiation receiving surface for effectively receiving and absorbing infrared radiation. Accordingly, it will be appreciated that the infrared radiation sensing device 30 should be fixed to one main surface of the insulating substrate 20 so that the black film 34 is exposed.

Figure 3:
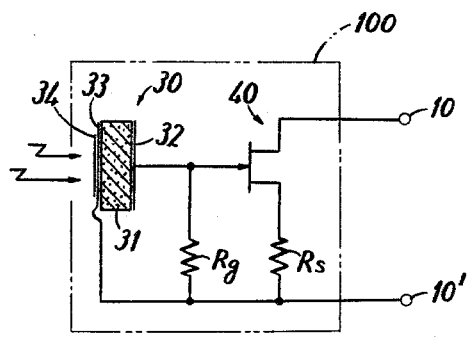
FIG. 3 is a schematic diagram of an equivalent circuit of the FIG. 2 embodiment.

A field effect transistor 40 is connected and fixed by lead wires to the other main surface of the insulating substrate 20 and is accommodated within the aperture 20a of the insulating substrate 20. In the case where no aperture 20a is provided, the field effect transistor 40 is simply located on the other main surface of the insulating substrate 20. Although not shown in FIG. 2, the insulating substrate 20 is formed with predetermined film resistor patterns on the surface thereof, as will be more fully described subsequently with reference to FIG. 13. The resistor patterns serve as operating resistors for the field effect transistor 40, as shown in FIG. 3. The infrared radiation sensing device 30, the field effect transistor 40 and the operating resistors Rg and Rs are connected in the manner shown in FIG. 3. Although these connections are not specifically shown in FIG. 2, they will be described in more detail subsequently with reference to FIGS. 13 to 15.

The external connection leads 10 and 10', the insulating substrate 20, the infrared radiation sensing device 30 and the field effect transistor 40 thus connected and fixed as described in the foregoing and as shown in FIGS. 2 and 3 are covered with a first covering resin layer 50, as shown in FIG. 2. More specifically, the first covering resin layer 50 is formed to cover the components 10, 10', 20, 30 and 40, excluding a portion of the radiation receiving surface of the infrared radiation sensing device 30 and the aperture 20a and periphery thereof and the tip ends of the external connection leads 10 and 10'. Preferably, the first covering resin layer 50 is made of phenol or epoxy porous insulating resin. The the whole outer surface of infrared radiation detecting apparatus 100 thus obtained is further coated with a second covering resin layer 60, which should be made of a resin material transparent to infrared radiation of the desired wavelength region, such as paraffin resin, polyethylene, polypropylene or the like. As best seen in FIG. 2, the second covering resin layer 60 is separated by a space 51 from the radiation receiving surface of the sensing device 30. Formation of the second covering resin layer 60 serves to prevent the heat generated in the infrared radiation device 30 by incident infrared radiation from being dissipated outward through the second covering resin layer 60.

If the field effect transistor 40 is provided so as to be accommodated in part in the aperture 20a, as seen in FIG. 2, then the infrared radiation detecting apparatus 100 can be made compact as a whole, and at the same time the field effect transistor 40 can be fixed firmly and stably in place by the first covering resin layer 50. Accordingly, the field effect transistor 40 is much less influenced by vibration or shock. In addition, the first and second covering resin layers 50 and 60 render the transistor 40 moisture-proof, and no additional resin coating for that purpose need be provided. As a result, a small and inexpensive field effect transistor can be employed.

In operation, when incident infrared radiation impinges on the infrared radiation detecting apparatus 100 structured and connected as shown in FIG. 3, the degree of polarization of the ceramic substrate 31 of the pyroelectric effect device, i.e. the infrared radiation sensing device 30, varies as a function of the amount of the incident infrared radiation to cause an electric charge to appear on the surfaces of the substrate 31, i.e. on the electrodes 32 and 33. The induced electric field undergoes impedance conversion and amplification by means of the field effect transistor 40, the output of which appears between the external connection leads 10 and 10'. Such pyroelectric effect type infrared detection has been fully described in PROCEEDINGS OF THE IEEE, VOL. 66, No. 1, "Pyroelectric Detectors and Materials", S.T. LIU et al. Infrared radiation can be detected by the inventive apparatus if its wavelength is in the region of 0.76 $\mu$m to 400 $\mu$m, generally defined as an infrared wavelength. However, the inventive apparatus can furthermore detect radiation of a wavelength slightly shorter than 0.76 $\mu$m.

FIG. 4 is a sectional view of another embodiment of the present invention. The FIG. 4 embodiment is different from the FIG. 2 embodiment in that the second resin layer 60 of the FIG. 4 embodiment is formed to cover the radiation receiving surface of the infrared radiation sensing device 30. Since the remaining portions of the FIG. 4 embodiment are substantially the same as those of the FIG. 2 embodiment, it is not believed necessary to describe the FIG. 4 embodiment in more detail.

FIG. 5 is a sectional view of a further embodiment of the present invention. A different feature of the FIG. 5 embodiment is that the external connection leads 10 and 10' are provided on one surface of the substrate 20 so as to extend parallel to the main surface of the insulating substrate 20. Again, the remaining portions of the FIG. 5 embodiment are substantially the same as those of the FIG. 2 embodiment, and it is not believed necessary to describe the FIG. 5 embodiment in greater detail. It is pointed out that the infrared radiation detecting apparatus 100 of a so-called longitudinal type structure as shown in FIG. 5 can be advantageously utilized in a situation where the detecting apparatus 100 is provided on a printed circuit board (not shown) such that the infrared radiation being detected is incident parallel to the surface of the printed circuit board.

Electrical connection of each of the embodiments shown in FIGS. 4 and 5 may be made as shown in FIG. 3. Although in the above described embodiments relatively hard pin-like members are employed as external connection leads 10 and 10', flexible insulated lead wires may be used in place of such pin-like leads. An infrared radiation detecting apparatus employing flexible insulated lead wires may be especially advantageously employed in a situation where the detecting apparatus is mounted directly on a metal plate, for example. More specifically, assuming a case where the infrared radiation detecting apparatus employing pin-like leads as external connection leads is mounted directly on a metallic plate, since the two leads 10 and 10' could be short-circuited through the metallic plate, it is necessary to provide a short-circuit preventing means, such as an insulating spacer. On the other hand, if an infrared radiation detecting apparatus employing flexible insulated lead wires is employed in such a situation, the above described necessity of a short-circuit preventing means is eliminated, while the freedom in mounting the detecting apparatus is increased as compared with a case of a detecting apparatus employing pin-like leads, with the result that the detecting apparatus can be mounted more compactly.

In case of any of the embodiments shown in FIGS. 2, 4 and 5, the infrared radiation sensing device 30 is fixed to the insulating substrate 20 with an electrically conductive adhesive agent and furthermore is firmly fixed in place by the first resin layer 50. Therefore, the sensing device 30 is stable and is little influenced by vibration and shock.

Now referring to FIGS. 6 to 12, a process for manufacturing the FIG. 2 infrared radiation detecting apparatus will be described in the following.

Figure 6:
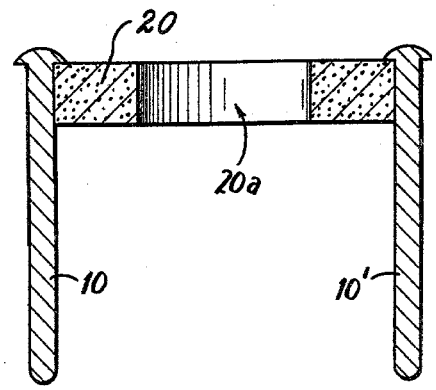

First referring to FIG. 6, an insulating substrate 20 with an aperture 20a is prepared. The insulating substrate 20 is shown in more detail in FIGS. 13A and 13B. FIG. 13A shows a plan view of one main surface of the insulating substrate 20 and FIG. 13B shows a plan view of the other main surface of the insulating substrate 20. As shown in FIGS. 13A and 13B, the insulating substrate 20 is formed with the above described aperture 20a in its central portion and with five notches 21, 22, 23, 24 and 25 at the periphery of the substrate 20. The notches 21, 22, and 24 are allotted for connecting lead wires of a field effect transistor 40, to be described subsequently, and the notches 23 and 25 are allotted for fixing the previously described external connection leads 10 and 10'. As best seen in FIG. 13A, a semi-circular electrically conductive pattern is formed on one main surface to extend around each of the notches 21 to 25. As best seen in FIG. 13B, other electrically conductive patterns are formed on the other main surface of the substrate 20 so as to connect the notches 24 and 25. Again referring to FIG. 13A, a film resistor 26 serving as the above described operating resistor Rg is printed along the periphery of the substrate 20, connecting the above described electrically conductive patterns formed around the notches 21 and 23. Similarly, another film resistor 28 serving as the above described operating resistor Rs is formed along the periphery of the substrate 20 connecting the electrically conductive patterns formed around the notches 22 and 25. Referring to FIG. 13A, another electrically conductive pattern 27 is formed along the periphery of the aperture 20a on the same surface as the resistors Rg and Rs and is electrically connected to the electrically conductive pattern formed around the notch 24. The conductive pattern 27 is electrically connected to the electrode 32 (see FIG. 14) when the sensing device 30 is fixed to the substrate 20, as will be described subsequently. Now referring to FIG. 13B, a further electrically conductive pattern 29 is formed on the other main surface of the substrate 20 in a circular strip with a diameter smaller than that of the substrate 20 and larger than that of the aperture 20a to form a connection between the conductive patterns formed around the notches 24 and 25. The insulating substrate 20 with the above described structure is prepared, and then the external connection leads 10 and 10' are inserted through the notches 23 and 25 and are electrically connected and fixed to the conductive patterns formed around the notches 23 and 25.

Figure 7:
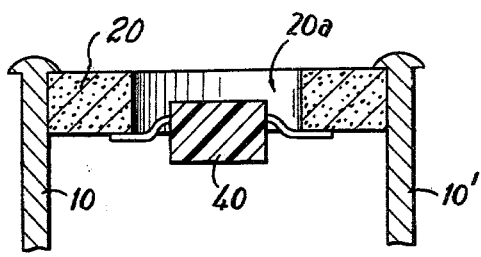

Referring to FIG. 7, a field effect transistor 40 is fixed to the the other main surface of the substrate 20, so that the field effect transistor 40 is in part accommodated in the aperture 20a. The gate electrode of the field effect transistor is electrically connected to the conductive pattern formed around the notch 24, the source electrode of the field effect transistor 40 is electrically connected to the conductive pattern formed around the notch 21, and the drain electrode of the field effect transistor 40 is electrically connected to the conductive pattern formed around the notch 22.

Figure 8:
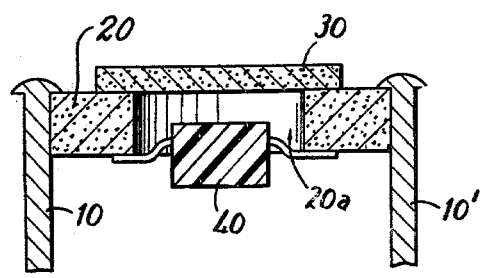

Referring now to FIG. 8, an infrared radiation sensing device 30 of such a structure as shown in FIG. 14 is fixed and electrically connected by the use of an electrically conductive adhesive agent to one main surface of the insulating substrate 20. As described previously, the infrared radiation sensing device 30 is placed such that the black film, i.e. the radiation receiving surface 34 of the sensing device 30, faces upward, as viewed in FIG. 8, and then the electrode 32 is electrically connected to the conductive pattern 27 of the substrate 20. The electrically conductive adhesive agent may be one which contains as a major ingredient an electrically conductive material such as Ag, Ni, Au or the like. FIGS. 15A and 15B show plan views of one main surface and the other main surface of the FIG. 8 apparatus, respectively. As best seen in FIG. 15A, the electrode 33 of the infrared radiation sensing device 30 is electrically connected to the conductive pattern formed around the notch 23 by means of wire bonding. Thus, the respective electrical connection portions are formed as shown in FIG. 3.

Figure 9:
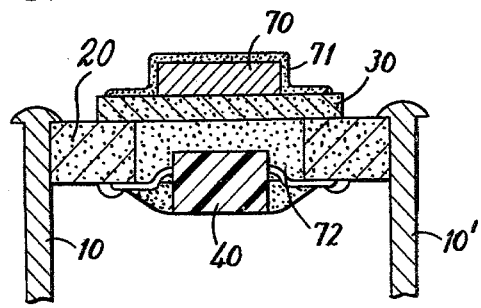

Now referring to FIG. 9, a chip 70 covered with a layer of a heat responsive solid/fluid convertible material 71 is placed on the radiation receiving surface of the infrared radiation sensing device 30. A similar heat responsive solid/fluid convertible material 72 is filled into the aperture 20a of the insulating substrate 20. The above described heat responsive solid/fluid convertible materials 71 and 72 are preferably one which is a solid and will maintain a given shape at normal temperature but is liquefied by being heated to an elevated temperature and is gasified by being heated to a further elevated temperature, such as wax, paraffin vaseline or the like. However, the above described heat responsive solid/fluid convertible materials 71 and 72 may be one which is solid or semisolid at normal temperature and is sublimated when heated to an elevated temperature. The chip 70 is preferably of a dense material which is unlikely to absorb the above described heat responsive solid/fluid convertible material, such as alumina ceramic, steatite ceramic, fosterite ceramic, beryllia ceramic or metal. In the case where the heat responsive solid/fluid convertible materials 71 and 72 are wax, the wax is adhered to surface of the chip 70 while the being heated to be liquefied. In such an instance, the chip 70 is temporarily fixed to the infrared radiation sensing device 30 by means of the liquefied wax, which facilitates fabricating work and thus enhances efficiency of fabrication.

It should be pointed out that in the present application the term "heat responsive solid/fluid convertible material" has been used broadly to cover all materials which are solid or semisolid and will maintain a given shape at normal temperature but is liquified, gasified or sublimated at an elevated temperature. In this context, it is intended that the term "solid" covers a semisolid state as well as a solid state. It should be further pointed out that in the above described embodiments the composite comprising the chip 70 covered with the heat responsive solid/fluid convertible material 71 is used as a space forming member for the purpose of forming a space when the composite is removed; for that purpose such a space forming member may comprise only a heat responsive solid/fluid convertible material, without including a chip, in which case the step of removing the chip 70, to be described subsequently, is of course dispensed with. As a matter of practice, a space forming member, irrespective of whether or not a chip is included, is fabricated as follows. A heat responsive solid/fluid convertible material in a semisolid state is given a suitable shape determined by the desired final shape of volume 51 (see FIG. 2) and is then dried to a solid state. The space forming member thus obtained is disposed on the radiation receiving surface of the sensing device 30 and, after the formation of the first resin layer 50, is heated to be liquefied, gasified or sublimated, by means of which phase change the material is removed.

The apparatus as shown in FIG. 9 is then naturally dried or heat dried and is then dipped in a solution of a porous insulating resin material, such as phenol resin or epoxy resin, whereby a first covering resin layer 50 is formed on the apparatus, as shown in FIG. 10. After the first covering resin layer 50 is formed on the apparatus as shown in FIG. 10, the composite structure thus obtained is heated to liquefy, gasify, or sublimate the heat responsive solid/fluid convertible materials 71 and 72, which pass through the first coating porous resin layer 50 and are externally discharged. As a result, a space 51 is formed as shown in FIG. 10 where the solid/fluid convertible materials 71 and 72 (see FIG. 9) existed previously. Thereafter the portion of the first covering resin layer 50 formed above the chip 70 down to the level shown by the dotted line in FIG. 10 is removed by means of a rotating grinder 80 having a flat grinding surface, so that the chip 70 and volume 51 are exposed.

Referring now to FIG. 11, the chip 70 thus exposed in the FIG. 10 step is then removed from the infrared radiation sensing device 30 by means of a vacuum sucking nozzle 90.

Referring to FIG. 12, the composite structure thus obtained is then dipped, with the side of the device from which the first covering resin layer 50 was removed facing downward, into a solution 60a of an infrared radiation transmitting resin material such as polyethylene, whereby a second covering resin layer 60 is formed as shown in FIG. 2. A space 51 as shown in FIG. 2 is thus formed between the sensing device 30 and the second covering resin layer 60 by virtue of the surface tension of the resin solution 60a. If a gas-producing agent such as acetone or ethyl alcohol is deposited in the opening 51 of the first covering resin layer 50 before the composite structure is dipped in the solution 60a in the step shown in FIG. 12, then the space 51 on the radiation receiving side of the sensing device 30 is further expanded by the gas, and as a result the dissipation of heat from the sensing device 30 can be further decreased. Thus the infrared radiation detecting apparatus 100 of the invention is completed.

Now returning to FIG. 4, in order to form the second covering resin layer 60 so that it is in contact with the infrared radiation sensing device 30, the composite structure is dipped into the resin solution 60a with the side opposite to the radiation receiving surface facing downward, or the composite structure can be dipped as shown in FIG. 12 if the solution 60a is vibrated or stirred to prevent the resin from forming a film across the mouth of volume 51 as shown in FIG. 2.

The FIG. 5 embodiment of infrared radiation detecting apparatus 100 may be manufactured substantially the same as described with reference to FIGS. 6 to 12 with respect to the FIG. 2 infrared radiation detecting apparatus 100, with the sole difference that the external connection leads 10 and 10' are mounted in a different direction with respect to the substrate 20. It is therefore not believed necessary to describe in more detail the process for manufacturing the embodiment of FIG. 5.

Although in the foregoing the present invention was described as having one infrared radiation sensing device on one insulating substrate, alternatively two or more infrared radiation sensing devices may be provided on one insulating substrate, each mounted on a separate aperture.

If the infrared radiation sensing device 30 is made of ceramic, it can do double duty as the insulating substrate 20 which can be dispensed with; hence the apparatus can be made more compact. The number of components is decreased, and the manufacturing process can be simplified, as a result of which the infrared radiation detecting apparatus can be made less expensive. It should be noted that if the pyroelectric effect device 30 is used as the insulating substrate, the field effect transistor 40 must simply be fixed to the surface of the sensing device 30 opposite to the radiation receiving surface.

Although the present invention has been described and illustrated in detail in connection with several preferred embodiments, many modifications and variations thereof will now be apparent to one skilled in the art, and the spirit and scope of the present invention are not to be limited by the details of the preferred embodiments herein described, but only by the terms of the appended claims.

What is claimed is:

1. An infrared radiation detecting apparatus, comprising:
   a substrate made of an insulating material;
   a thermal type infrared radiation sensing device having first and second opposing main surfaces; said first main surface constituting a radiation receiving surface; said thermal type sensing device being thermally responsive to heat caused by infrared radiation incident upon said radiation receiving surface, and generating an electrical signal responsive to infrared radiation incident upon said radiation receiving surface;
   external connection lead means secured to said insulating substrate and electrically connected to said thermal type infrared radiation sensing device;
   a first resin layer covering said thermal type infrared radiation sensing device except for said radiation receiving surface thereof, and covering said insulating substrate and a portion of said external connection lead means; and
   a second resin layer covering said first resin layer and said radiation receiving surface, and being transparent to infrared radiation of frequencies it is desired to detect.

2. An infrared radiation detecting apparatus in accordance with claim 1, wherein said first resin layer is made of porous resin.

3. An infrared radiation detecting apparatus in accordance with claim 2, wherein said porous resin in thermosetting resin.

4. An infrared radiation detecting apparatus in accordance with claim 1, wherein said second resin layer is made of paraffin resin.

5. An infrared radiation detecting apparatus in accordance with claim 1, wherein said second resin layer is formed in contact with said radiation receiving surface of said infrared radiation sensing device means.

6. An infrared radiation detecting apparatus in accordance with claim 1, wherein said second resin layer is formed spaced apart from and does not touch said radiation receiving surface of said infrared radiation sensing device, whereby a space is formed which is defined between said second resin layer and said radiation receiving surface of said thermal type infrared radiation sensing device.

7. An infrared radiation detecting apparatus in accordance with claim 1, wherein said thermal type device comprises a thermistor bolometer.

8. An infrared radiation detecting apparatus in accordance with claim 1, wherein said thermal type device comprises pyroelectric effect device means.

9. An infrared radiation detecting apparatus in accordance with claim 8, wherein said pyroelectric effect device means comprises:
   a ceramic plate having two opposing major surfaces;
   first electrode means formed on one of said two major surfaces of said ceramic plate, and second electrode means formed on the other of said two major surfaces of said ceramic plate; and
   a black film formed on said first electrode means, said first electrode means constituting said radiation receiving surface.

10. An infrared radiation detecting apparatus in accordance with claim 9, which further comprises field effect transistor means electrically connected to said pyroelectric effect device means for impedance conversion and amplification of said electrical signal; said field effect transistor means being electrically connected both to said first electrode means and to said external connection lead means for amplifying said electrical signal and for providing said electrical signal to said external connection lead means; said first resin layer covering said field effect transistor means.

11. An infrared radiation detecting apparatus in accordance with claim 10, which further comprises operating resistor means electrically connected to said field effect transistor means, said operating resistor means being printed on said insulating substrate.

12. An infrared radiation detecting apparatus in accordance with claim 11, wherein said field effect transistor means is provided on said second main surface of said insulating substrate.

13. An infrared radiation detecting apparatus in accordance with claim 12, wherein said insulating substrate has an aperture in which said field effect transistor means is accommodated.

14. An infrared radiation detecting apparatus in accordance with claim 1, wherein said external connection lead means is fixed to said insulating substrate so as to extend in a direction normal to said major surfaces of said insulating substrate.

15. An infrared radiation detecting apparatus in accordance with claim 1, wherein said external connection lead means is fixed to said insulating substrate so as to extend parallel to said major surfaces of said insulating substrate.

16. An infrared radiation detecting apparatus in accordance with claim 1, wherein said external connection lead means comprises a flexible insulated lead wire.

17. An infrared radiation detecting apparatus, comprising:
- a pyroelectric effect device comprising a ceramic plate having first and second opposing main surfaces, first and second electrode means formed respectively on said first and second main surfaces of said ceramic plate, and a layer of a heat absorbing material formed on said first electrode means for constituting a radiation receiving surface; said pyroelectric effect device generating an electrical signal responsive to heat caused by infrared radiation incident on said radiation receiving surface;
- external connection lead means secured to said pyroelectric effect device and electrically connected to said electrode means of said pyroelectric effect device;
- a first resin layer covering said pyroelectric device except said radiation receiving surface of said pyroelectric device, and covering a portion of said external connection lead means; and
- a second resin layer covering said first resin layer and said radiation receiving surface, said second resin layer being transparent to infrared radiation of frequencies it is desired to detect.

18. An infrared radiation detecting apparatus in accordance with claim 17, wherein said first resin layer is made of porous resin.

19. An infrared radiation detecting apparatus in accordance with claim 18, wherein said porous resin is thermosetting resin.

20. An infrared radiation detecting apparatus in accordance with claim 17, wherein said second resin layer is made of paraffin resin.

21. An infrared radiation detecting apparatus in accordance with claim 17, wherein said second resin layer is formed in contact with said radiation receiving surface of said pyroelectric effect device means.

22. An infrared radiation detecting apparatus in accordance with claim 17, wherein said second resin layer is formed spaced apart from and does not touch said radiation receiving surface of said pyroelectric effect device, whereby a space is formed which is defined between said second resin layer and said radiation receiving surface of said infrared radiation sensing device means.

23. An infrared radiation detecting apparatus in accordance with claim 17, which further comprises field effect transistor means electrically connected to said pyroelectric effect device for impedance conversion and amplification of said electrical signal, said field effect transistor means being electrically connected both to said first electrode means and to said external connection lead means for amplifying said electrical signal and for providing said electrical signal to said external connection lead means; said first resin layer covering said field effect transistor means.

24. An infrared radiation detecting apparatus in accordance with claim 17, wherein said external connection lead means is secured to said radiation receiving surface of said pyroelectric effect device so as to extend in a direction normal to said main surfaces of said ceramic plate.

25. An infrared radiation detecting apparatus in accordance with claim 17, wherein said external connection lead means is secured to said pyroelectric effect device so as to extend parallel to said radiation receiving surface of said pyroelectric effect device.

26. An infrared radiation detecting apparatus in accordance with claim 17, wherein said external connection lead means comprises a flexible insulated lead wire.

27. An infrared radiation detecting apparatus according to claim 17 or claim 1, wherein said first resin layer is opaque.

* * * * *